United States Patent [19]
Fukaya

[11] 3,969,653
[45] July 13, 1976

[54] DEFLECTION CIRCUIT FOR TELEVISION RECEIVER SET OR THE LIKE
[75] Inventor: Hirokazu Fukaya, Tokyo, Japan
[73] Assignee: Nippon Electric Company, Ltd., Tokyo, Japan
[22] Filed: Dec. 24, 1974
[21] Appl. No.: 536,098

[30] Foreign Application Priority Data
Dec. 28, 1973 Japan................................. 49-494

[52] U.S. Cl. ............................ 315/403; 315/384; 315/387; 315/396; 315/408
[51] Int. Cl.² .................... H01J 29/70; H01J 29/76
[58] Field of Search .......... 315/396, 399, 403, 407, 315/384, 385, 387, 388, 389, 409

[56] References Cited
UNITED STATES PATENTS
3,602,768  8/1971  Williams, Jr. et al. ............. 315/403
3,710,171  1/1973  Ree ................................... 315/403
3,731,138  5/1973  Elias et al. ......................... 315/403
3,781,589  12/1973 Brockmann ....................... 315/387
3,879,637  4/1975  Woodworth ...................... 315/409

Primary Examiner—Maynard R. Wilbur
Assistant Examiner—T. M. Blum
Attorney, Agent, or Firm—Hopgood, Calimafde, Kalil, Blaustein & Lieberman

[57] ABSTRACT

A deflection circuit for a television receiver is made more suitable for single chip integrated circuit construction by utilizing a switching means connected between a part of the transistor amplifier used to amplify a saw-tooth wave form and a power source. This permits a part of the energy stored in the deflection coil to be released through the amplifier during retrace intervals.

7 Claims, 8 Drawing Figures

DEFLECTION CIRCUIT FOR TELEVISION RECEIVER SET OR THE LIKE

BACKGROUND OF THE INVENTION

The present invention relates to a deflection circuit for a television receiver or the like.

A conventional deflection circuit for a television receiver includes by a transistor amplifier having a single-ended push-pull output circuit and a reflection coil. One of the output transistors of the single-ended push-pull circuit exhibits high-power consumption, because it is constructed to operate in both normal and inverse transistor modes. Such a circuit configuration is not suitable for a semiconductor integrated circuit.

To achieve the desired semiconductor integrated circuit including the deflection circuit, another circuit configuration has also been proposed. In this circuit, a bypass diode is added to the above-mentioned deflection circuit between the output terminal of the single-ended push-pull circuit and a pre-determined terminal of the power supply means. They bypass diode, however, also requires an area large enough to carry the large current. Therefore, it is still difficult to construct the entire circuit as one semiconductor chip. Usually, the circuit except for the bypass diode is constructed as a semiconductor chip, and the bypass diode is externally connected to the integrated circuit device. This reduces the ease of circuit assembly.

SUMMARY OF THE INVENTION

The primary object of the present invention is to obtain a deflection circuit well suited for semiconductor integrated circuit construction.

With this and other objects in view, the present invention provides a deflection circuit comprising a switching means disposed between one end of the power supply means and the input terminal of a transistor which amplifies an input saw-tooth current and supplies the amplified current to the deflection coil. This switching means causes the transistor to turn on for at least one part of the retrace time according to the pulse generated in the deflection coil for the retrace time.

According to the present invention, the transistor supplying the amplified current to the deflection coil operates only in the normal mode and the switching means does not require a large current flow but only a small current flow sufficient to turn on the above-mentioned transistor. The elements do not require large dimensions, and the switching means especially needs a very small space to carry small currents. Therefore, the deflection circuit of the present invention is easily constructed as one semiconductor chip and as an integrated-circuit. This results in cost reduction and high production yield.

BRIEF DESCRIPTION OF THE DRAWINGS

The other objects, features and advantages of the invention will become more apparent from the following detailed description taken in conjunction with the accompanying drawings, wherein.

DESCRIPTION OF THE PREFERRED EMBODIMENT

Figure 1A:
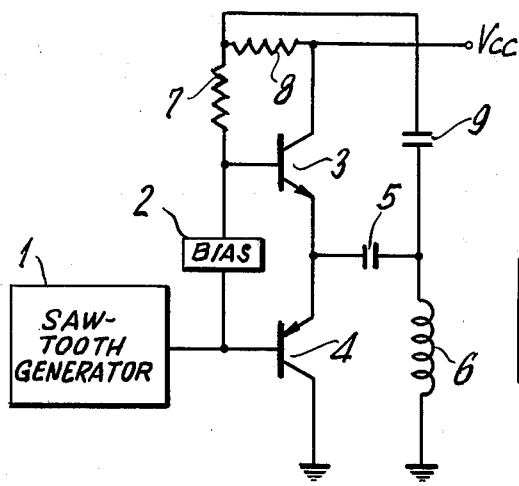
FIGS. 1a and 1b show circuit diagrams of conventional prior art deflection circuits.

A conventional vertical deflection circuit is fully explained thereafter with reference to FIGS. 1a, 2a and 2b. A signal of a saw-tooth wave form produced by a generator 1 is supplyed to an amplifier having including two transistors 3 and 4, and the amplified signal is supplied to a deflection coil 6 of a deflection yoke through a capacitor 5, causing a saw-tooth current to flow in the coil 6. The deflection circuit further comprises a bias means 2, which may be forward biased diodes, and the transistors 3 and 4 are a complementary pair connected in a single-ended push-pull circuit configuration. A capacitor 9 is connected between the junction of the capacitor 5 and the coil 6 and the junction of two resistors 7 and 8. This capacitor serves as a bootstrap capacitor causing the base potential of the transistor 3 to exceed the power source voltage, thus allowing the transistor 3 to operate in the saturation region.

Figure 2:
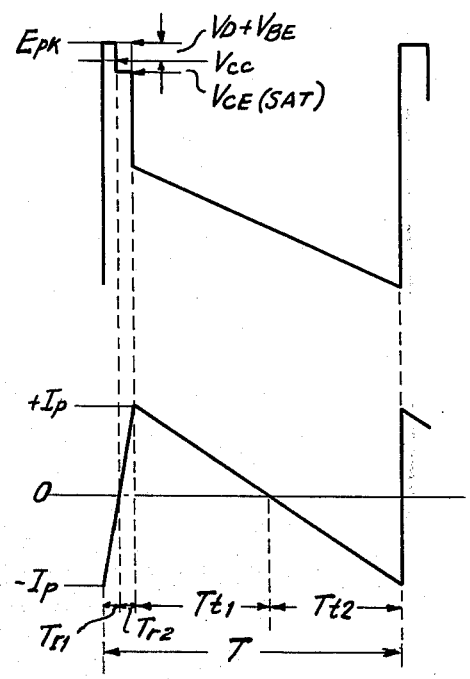
FIG. 2 is a diagram that illustrates the operation of deflection circuits.

When a saw-tooth wave from the saw-tooth wave generator 1 is applied to the base of the transistor 4, an output waveform as shown in the upper portion of FIG. 2 appears at the junction of the emitters of transistors 3 and 4, and a current in the waveform shown in the lower portion of FIG. 2 flows in the deflection coil 6. An impulse is generated during the retrace time because the deflection coil 6 functions as an inductance element for a period of the input saw-tooth wave corresponding to the retrace time. The voltage of this flyback pulse is given roughly as follows.

$$E = L \frac{Ipp}{Tr_1 + Tr_2}$$

where
E : the flyback pulse voltage
L : the inductance of the deflection coil
Ipp : the peak-to-peak value of the current flowing in the deflection coil
$Tr_1+Tr_2$ : the period of the retrace time The portion of the pulse appearing for the period ($Tt_1 + Tt_2$) of the lower portion of FIG. 2 indicates the voltage corresponding to the input saw-tooth wave. For these periods $Tt_1$, $Tt_2$, the transistors 3 and 4 operate as a class-B push-pull amplifier, and the deflection coil serves as a resistive element. The pulse shown in the upper portion of FIG. 2 is considered to be present in an ideal state where such factors as compensation for distortion of the picture and influence due to the capacitor 2 and associated circuit are ignored.

During the period $Tr_1$, the inductive energy stored in the deflection coil is released. Such energy corresponds to a voltage potential exceeding the power supply voltage Vcc. The bootstrap circuit serves to raise the base potential of transistor 3 above the power sourse voltage Vcc, with the result that the transistor 3 operates as an inverse transistor. Under this condition a current flows in the circuit by way of the capacitor 5, the emitter of the transistor 3, the collector of the transistor 3 and the power source. Thus the transistor 3 clamps the pulse voltage to the power source voltage Vcc.

For the period $Tr_2$, a pulse defined by the above equation is generated to saturate the transistor 3 by the bootstrap effect, with the result that a current flows in the deflection coil by way of power source, the transistor 3 and the capatitor 5, in the direction opposite to the previous one. In this period Tr₂, the transistor 3 operates in a normal action mode.

In this deflection circuit, the transistor 3 should be operated not only in the conventional manner but also as an inverted transistor wherein the emitter functions as the collector, and the collector the emitter. In other words, the transistor 3 possesses the function of the bidirectional transistor having a high break-down voltage at both the junctions of emitter and base and of collector and base.

Under the pressure of present technical needs, the deflection circuit should be provided in an integrated circuit form. In point of fact, however, there are technical limitations in integrating a deflection circuit which uses a bidirectional transistor.

Figure 1B:
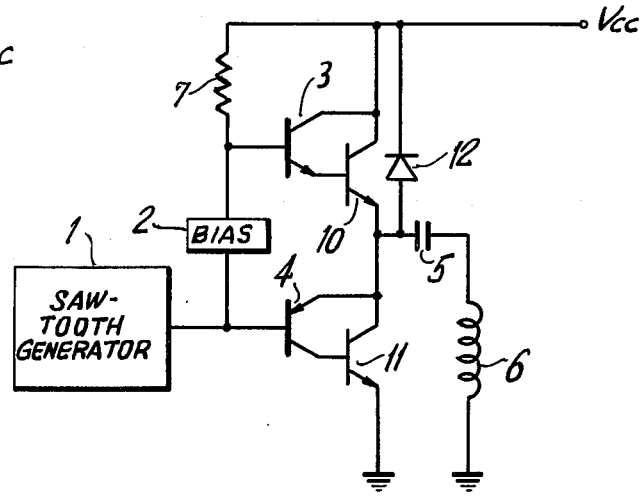

One well-known approach to the above problem is shown in FIG. 1b. Transistors 13 and 10, and transistors 14 and 11, are respectively connected in Darlington connections and operated as the transistors 3 and 4 shown in FIG. 1a; the first pair operates as an NPN transistor, and the second pair as a PNP transistor. A diode 12 is added to provide a current path for the period Tr₁ of the lower part of FIG. 2.

In this circuit, the diode 12 must have a capacity large enough to pass half the deflection current, i.e., Ip in FIG. 2. This diode 12 necessitates as large an area as needed by the output transistor on a semiconductor chip of the integrated circuit. Therefore, even if the diode 12 is integrated in the same semiconductor chip, a high cost and a low production yield result. In general, the diode is excepted from the semiconductor integrated circuit and is connected in the assembly prosses of the television receiver set. This also results in an intricate assembly prosses, high cost and low reliability of the set.

Figure 3:
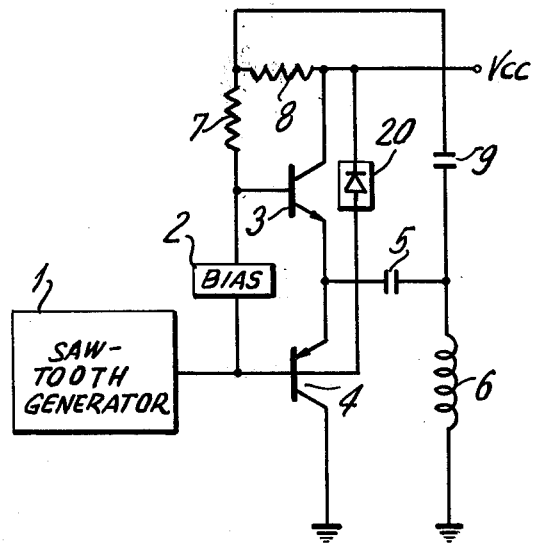
FIGS. 3 through 7 show circuit diagrams of various embodiments of the present invention.

Referring now to FIG. 3, in which the elements having the same functions as in FIG. 1a are denoted by the same numerals as in FIG. 1a, the first embodiment of the present invention is also provided with a saw-tooth signal generator 1, a bias means 2, a complementary pair of transistors 3 and 4 forming a single-ended push-pull amplifier, a capacitor 5, a deflection coil 6, a bootstrap capacitor 9 and resistors 7 and 8 and a power source of voltage Vcc. In this embodiment, a diode 20 is added between the base of the transistor 4 and the power supplying line in reverse orientation.

During the scanning period, i.e., the periods Tt₁, Tt₂ shown in the lower portion of FIG. 2b, this circuit operates in the same manner as has been described previously. During the period Tr₁, a flyback pulse exceeding the power supply voltage Vcc in potential is generated in the deflection coil 6, and the potential at the common emitter junction between transistors 3 and 4 is raised accordingly. The base current of the transistor 4 flows as the sum of the currents caused by the saw-tooth signal provided from the generator 1 and by the action of the diode 20. The current through the diode 20 is caused by releasing the energy stored in the deflection coil 6 by way of deflection coil 6, the capacitor 5, the emitter of transistor 4, the base of transistor 4, the diode 20. As a result, the transistor 4 turns on, whereby the energy stored in the coil 6 is released by way of the capacitor 5 and the transistor 4. Thus the energy is stored in the capacitor 5.

During the period Tr₂, the transistor 3 is saturated by the flyback pulse to allow a current to flow by way of power source, the transistor 3, the capacitor 5 and the coil 6 in the direction opposite to that in operation during Tr₁.

The waveform of this flyback pulse is slightly different from the one shown in the foregoing prior art example; that is, during the period Tr₁, the potential at the output terminal is clamped at a value higher than Vcc by the sum of the forward voltage of diode 20 and the emitterbase forward voltage of transistor 4. During the period Tr₂, it is clamped at a value lower than Vcc by the saturation voltage of the transistor 3 as indicated by the heavy line in the lower portion of FIG. 2. Therefore, it is noted that the transistor 4 remains off during the period Tr₂.

In this embodiment, a current small enough to turn on the transistor 4 flows through the diode 20. Therefore, no large current capacitor is required against the diode 20 to permit the construction of the diode 20 with very small dimensions. No bidirectionally functioning transistor is required. This results in the relatively easy formation of a deflection circuit in semiconductor integrated form.

Further, this result in the additional advantage of an easy assembling process, compared with the prior art of FIG. 1b.

Figure 4:
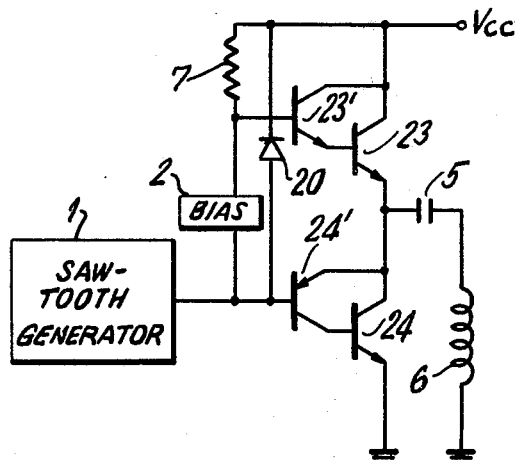

FIG. 4 shows a second embodiment of the present invention suitable for fabrication as an integrated circuit. The Darlignton connections of transistors 23 and 23' and transistors 24 and 24' are connected in single-ended push-pull amplifier fashion. The remaining circuit configuration is the same as in FIG. 1 and denoted by the same numerals as of FIG. 1, but the bootstrap circuit is eliminated. The transistor 24 is used to compensate for the characteristics of the PNP transistor 24' having, in general, deteriorated electric characteristics. A diode 20 is connected between the base of transistor 4 and the power source terminal, and is operated in the manner same as in the first embodiment. This circuit uses no bootstrap circuit and hence the voltage at the output terminal assumes a value lower than Vcc by the sum of the base-emitter voltages of transistors 23 and 23'.

Since the Darlington connected PNP transistor is used and the bootstrap capacitor is eleminated, this example is extremly well suited for fabrication as a semiconductor integrated circuit.

Figure 5:
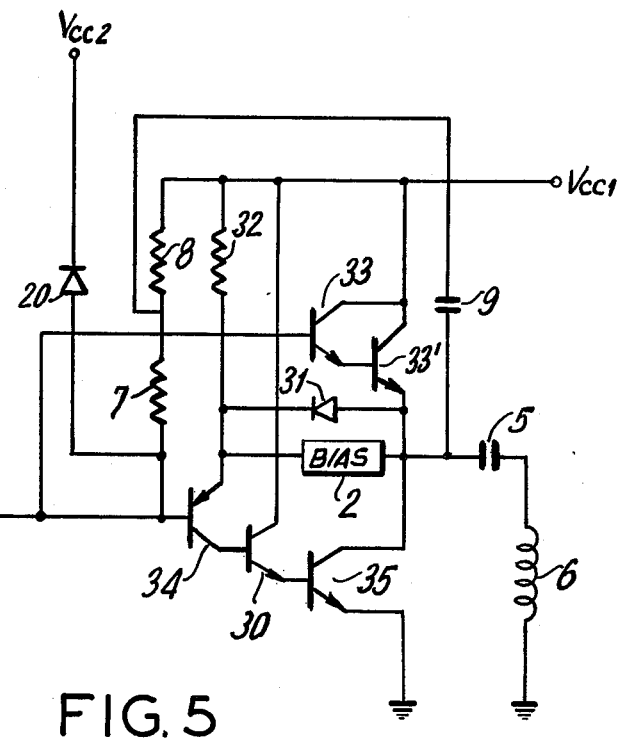

FIG. 5 shows a third example of the present invention. The bases of a pair of complementary transistors 33 and 34 are used as the input terminal for the signal from the saw-tooth generator 1. The transistors 33 and 33' form a Darlington connection and act as an NPN output transistor, while the circuit of the transistors 30, 34 and 35 acts as a PNP output transistor. These output transistor circuits operate in a single-ended push-pull fashion. A resistor 32 is inserted between the emitter of the transistor 34 and the positive terminal of the first power source Vcc₁. A bias means 2 is provided with one end connected between the emitter of the transistor 34 and the other end connected to a junction between the emitter of the transistor 33' and the collector of the transistor 35.

A diode 20 is connected between the base of the transistor 34 and a second power source, whereby the flyback pulse generated in the deflection coil 6 is clamped at the voltage level Vcc₂ of a second power source. A diode 31 is inserted to cause current to flow from the deflection coil 6 to ground through the transistor 34 during the retrace time. This is very effective when the bias means 2 offers a high impedance during the retrace time. Therefore, it is unnecessary when the bias means 2 is capable of causing the energy stored in the coil 6 to be fully released through the emitter of transistor 4 during the retrace time.

This deflection circuit can readily be fabricated as an integrated circuit because it is easier to obtain characteristic uniformity for the compound transistor consisting of the transistors 33 and 33' and the compound transistor consisting of the transistors 30, 34 and 35.

Figure 6:
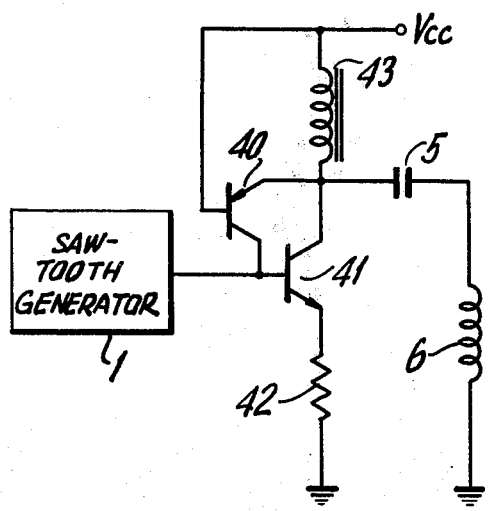

FIG. 6 shows the fourth embodiment of the present invention applied to a choke-coupling electromagnetic deflection circuit. The output of the saw-tooth generator 1 is supplied to the base of the transistor 41 with an emitter thereof grounded through the resistor 42. The collector of the transistor 41 is electrically connected to a power source of voltage Vcc by way of the choke 43, and to the deflection coil 6 through the capacitor 5.

In this embodiment a transistor 40 of which the collector, emitter and base are respectively connected to the base and collector of the transistor 41, and the power supplying line, is used as a switching means.

During the first half portion of the retrace time, a transistor 40 is turned on to cause the collector of the transistor 41 to be clamped by the voltage of the flyback pulse which is equal to the power supply voltage Vcc. At the same time, the energy stored in the deflection coil 6 is released. During the second half of the retrace time, the current flows into the deflection coil 6 through the choke 43. The transistor 41 remains in a conducting state throughout the entire retrace time irrespective of the input signal. In this embodiment, the clamping level of the flyback pulse can be adjusted by inserting a contant voltage element, such as zenner diode, a parallel connected capacitor-resistor circuit, or the like in the emitter or in the base of the transistor 40.

Figure 7:
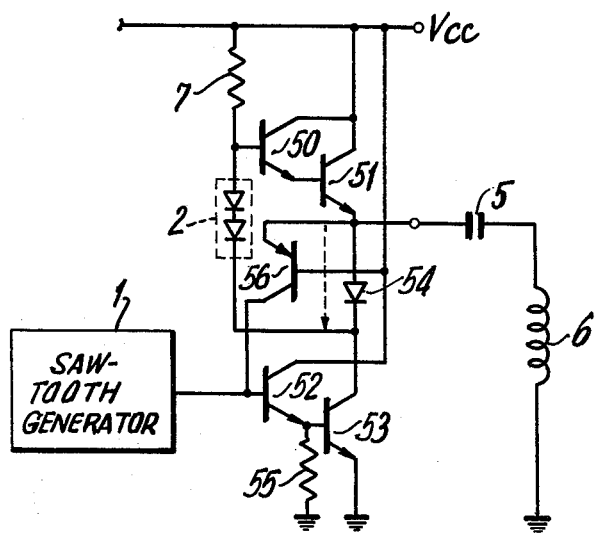

FIG. 7 shows the fifth embodiment of the present invention applied to a deflection circuit using a shunt-regulated push-pull circuit. With the aid of the bias means 2, the diode 54 and ther resistors 7 and 55, the Darlington connected transistors 50 and 51 operate for the positive half portion of the input signal from the saw-tooth generator and the Darlington connected transistors 52 and 53 operate for the negative half portion, thus forming push-pull amplifier. A transistor 56 is inserted as a switching means withits collector connected to the base of the transistor 52, its base, to the collector of the transistor 52 and the power supplying line and its emitter, to the emitter of the transistor 51 or the collector of the transistor 53. The transistor 56 turns on during the retrace time and functions as a switching element in the manner described in the fourth embodiment.

As will be apparent from the foregoing description, the switching means used in the deflection circuit according to the present invention can be small in size owing to the fact that it is used only to control the input current to the circuit which provides an output saw-tooth current. Therefore the deflection circuit of the present invention is very easily constructed as a semiconductor integrated circuit without any transistor operating bidirectionally and without a large diode to carry a large current.

Although the invention has been described in connection with vertical deflecting circuits used in a television receiver, the invention is not limited to this type of deflection circuits but applicable to similar circuits such as, for example, a sweep circuit used for other display devices, which generates a pulse during retrace time. The above description of various exemplary embodiments are intended to illustrate the concept of the invention and should not be construed as a limitation on its scope.

What is claimed is:

1. A deflection circuit comprising;
   a power source for providing a first voltage;
   a saw-tooth wave source means for generating a saw-tooth wave signal having a blanking signal at retrace periods;
   a power amplifier including a transistor amplifier and a load therefor connected in series with said transistor amplifier, said power amplifier being connected to amplify said saw-tooth wave signal from said saw-tooth wave source;
   means for turning off said transistor amplifier in response to said blanking signal;
   a deflection coil connected to receive current supplied from said power amplifier,
   means for producing a second voltage; and
   switching means connected between the input terminal of said transistor amplifier and said means for producing a second voltage, said switching means causing said transistor amplifier to turn on in response to current from said deflection coil during said retrace period.

2. The circuit of claim 1, wherein said switching means is a diode.

3. The circuit of claim 1, wherein said switching means is a diode and said load is a transistor circuit arranged in a push-pull configuration along with said transistor amplifier.

4. The circuit of claim 3, wherein the transistor amplifier comprises at least two transistors arranged to operate as the equivalent of a single transistor.

5. The circuit of claim 3, wherein the transistor amplifier comprises at least two transistors arranged in a Darlington connection.

6. The circuit of claim 3, wherein said transistor circuit comprises at least two transistors arranged as the equivalent of a single transistor.

7. The circuit of claim 3, wherein said transistor circuit comprises at least two transistors arranged in a Darlington connection.

* * * * *